(12) United States Patent
Nagashima

(10) Patent No.: US 6,785,158 B2
(45) Date of Patent: Aug. 31, 2004

(54) DEVICE THAT MAKES IT POSSIBLE TO SELECTIVELY USE NONVOLATILE MEMORY AS RAM OR ROM

(75) Inventor: Hidenori Nagashima, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/301,742

(22) Filed: Nov. 22, 2002

(65) Prior Publication Data

US 2003/0214834 A1 Nov. 20, 2003

(30) Foreign Application Priority Data

May 15, 2002 (JP) ........................................ 2002-140045

(51) Int. Cl.⁷ ............................ G11C 11/00; G11C 7/02
(52) U.S. Cl. ...................................... 365/157; 365/213
(58) Field of Search ............................... 365/157, 209, 365/232, 191

(56) References Cited

U.S. PATENT DOCUMENTS 6,643,213 B2 * 11/2003 Perner et al. .......... 365/230.06

2003/0031046 A1 * 2/2003 Hidaka ..................... 365/171

FOREIGN PATENT DOCUMENTS

JP 2002-8367 1/2002

* cited by examiner

*Primary Examiner*—Thong Le
(74) *Attorney, Agent, or Firm*—Burns, Doane, Swecker & Mathis, L.L.P.

(57) ABSTRACT

Nonvolatile memory cells are arranged at crossing points of bit-lines and word-lines. A mode signal indicates whether the nonvolatile memory cells are to be used as a RAM or as a ROM. When the nonvolatile memory cells are to be used as RAM, current is allowed to flow through the bit-lines in one specific direction, current is allowed to flow through the word-lines and the direction of the current flowing through the word-lines is adjusted to write data in the nonvolatile memory cells. When the nonvolatile memory cells are to be used as ROM, no current is allowed to flow through the bit-lines or the word-lines so that data can not be written in the nonvolatile memory cells.

19 Claims, 6 Drawing Sheets

DEVICE THAT MAKES IT POSSIBLE TO SELECTIVELY USE NONVOLATILE MEMORY AS RAM OR ROM

BACKGROUND OF THE INVENTION

1) Field of the Invention

The present invention relates to a device that controls writing on a nonvolatile memory and makes it possible to selectively use the nonvolatile memory as a ROM or a RAM. The nonvolatile memory is, for example a magnetic random access memory (MRAM), that allows fast random access.

2) Description of the Related Art

The MRAM is a semiconductor memory that has been newly developed. The MRAM is better in many aspects as compared to the other semiconductor memories. That is, the MRAM is better in nonvolatility, can be driven at lower voltage, does not cause destruction when reading-out, writing can be performed faster (for example, in 5 ns), and writing can be repeated more times (for example, more than 1015 times) Therefore, it may be effective to use the MRAM's instead of the conventional read-only-memories (ROM's) or the random-access-memories (RAM's).

However, the MRAM's can not be used instead of the ROM's, because the there is a fear that the contents of the MRAM's are easily over-written when there occurs runaway of a computer program or the like. Moreover, the MRAM's cannot also be used instead of the RAM's, because data remains in the MRAM's even after power supply is switched and an ill minded person can easily still the data. Thus, the MRAM's are less secure.

SUMMARY OF THE INVENTION

It is an object of this invention to provide a device that makes it possible to use a nonvolatile memory (e.g., the MRAM) as both, the ROM and the RAM.

According to the present invention, nonvolatile memory cells are arranged at crossing points of bit-lines and word-lines. A mode signal that indicates whether the nonvolatile memory cells are to be used as RAM or ROM is generated. When the mode signal indicates that the nonvolatile memory cells are used as RAM, current is allowed to flow through the bit-lines in one specific direction, current is allowed to flow through the word-lines and the direction of the current flowing through the word-lines is adjusted to write data in the nonvolatile memory cells. When the mode signal indicates that the nonvolatile memory cells are used as ROM no current is allowed to flow through the bit-lines or the word-lines so that data can not be written in the nonvolatile memory cells. A control unit controls supply of current to the bit-lines and the word-lines based on the mode signal.

These and other objects, features and advantages of the present invention are specifically set forth in or will become apparent from the following detailed descriptions of the invention when read in conjunction with the accompanying drawings.

DETAILED DESCRIPTIONS

Before proceeding to an explanation of the embodiments of the present invention, how a write control is provided on the MRAM will be explained using FIG. 1 to FIG. 3. The MRAM is an example of nonvolatile memories that allow fast random access.

Figure 1:
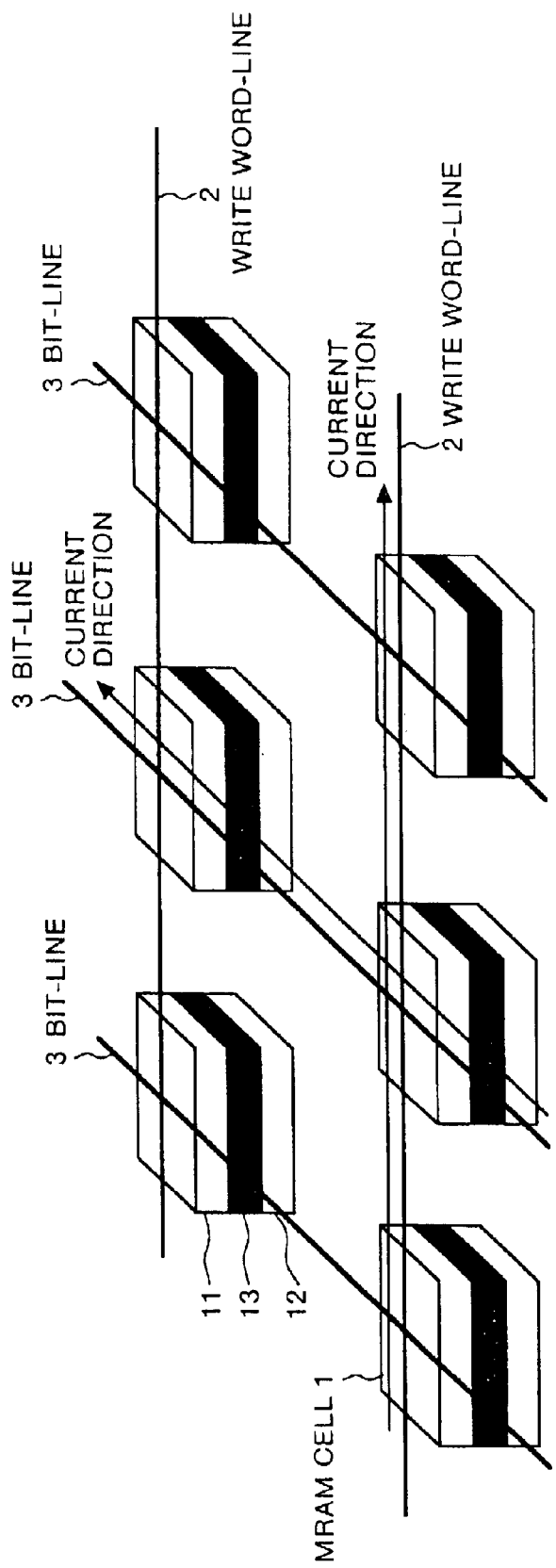
FIG. 1 shows an arrangement of MRAM cells for explaining a write operation in an MRAM.

FIG. 1 shows an arrangement of MRAM cells for explaining a write operation in the MRAM. FIG. 2 is a circuit diagram of a control circuit that drives the write word-line shown in FIG. 1. FIG. 3 is a circuit diagram of a control circuit that drives the bit-line shown in FIG. 1.

As shown in FIG. 1, in the MRAM, write word-lines 2 and bit-lines 3 are provided in a matrix form, and one MRAM cell 1 is provided at each intersection of the write word-lines 2 and bit-lines 3. The write word-lines 2 serve as selection lines in the lateral direction. The bit-lines 3 serve as selection lines in the longitudinal direction. Data is written in the MRAM cells 1 using the write word-lines 2 and the bit-lines 3.

The MRAM cells 1 are typically the tunneling magneto-resistive (TMR) elements. As shown in FIG. 1, each MRAM cell 1 has a structure in which an insulation film 13 is interposed between two magnetic thin films 11 and 12. An arrangement is made such that the direction of magnetization of the bottom magnetic thin film 12 does not change. The sense of the current flown through the write word-line 2 is changed. A current is flown through the bit-line 3 only in one direction. Thus, there are formed a state in which the magnetization direction of the top magnetic thin film 11 coincides with the magnetization direction of the bottom magnetic thin film 12, and a state in which the magnetization direction of the top magnetic thin film 11 is opposite to the magnetization direction of the bottom magnetic thin film 12. As a result, bit information of "1" and "0" is written.

Figure 2:
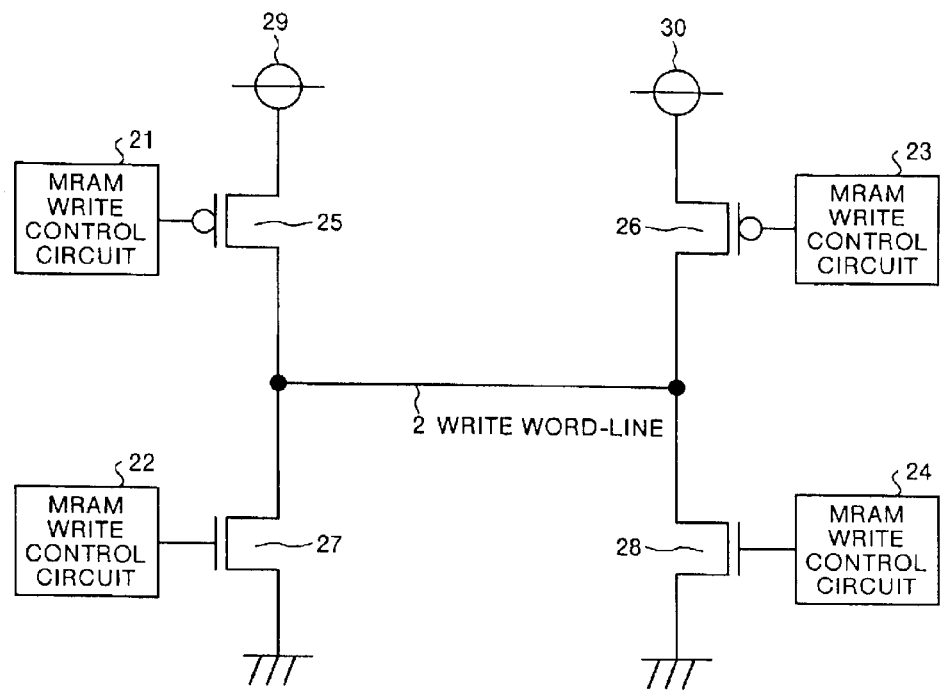
FIG. 2 is a circuit diagram of a control circuit that drives the write word-line shown in FIG. 1.

As shown in FIG. 2, the control circuit that drives any one of the write word-lines 2 includes four MRAM write control circuits 21 to 24, two PMOS transistors 25 and 26, and two NMOS transistors 27 and 28.

An output terminal of the MRAM write-control circuit 21 is connected to the gate of the PMOS transistor 25. The source of the PMOS transistor 25 is connected to a power supply 29. The drain of the PMOS transistor 25 is connected to the drain of the NMOS transistor 27. An output terminal of the MRAM write-control circuit 22 is connected to the gate of the NMOS transistor 27. The source of the NMOS transistor 27 is connected to ground.

An output terminal of the MRAM write-control circuit 23 is connected to the gate of the PMOS transistor 26. The source of the PMOS transistor 26 is connected to a power supply 30. The drain of the PMOS transistor 26 is connected to the drain of the NMOS transistor 28. An output terminal of the MRAM write-control circuit 24 is connected to the gate of the NMOS transistor 28. The source of the NMOS transistor 28 is connected to ground. A connection terminal between drains of the PMOS transistor 25 and the NMOS transistor 27 is connected to a connection terminal between drains of the PMOS transistor 26 and the NMOS transistor 28 via a write word-line 2.

On the basis of a write enable signal, a value, and an address signal, the MRAM write-control circuits 21 to 24 select a write word-line 2 through which a current should flow, and control a direction of the current to be flown through the selected write word-line 2. In the configuration of FIG. 2, the sense of the current flown through the write word-line 2 is controlled depending on whether the PMOS transistor 25 and the NMOS transistor 28 are turned on or the PMOS transistor 26 and the NMOS transistor 27 are turned on.

Figure 3:
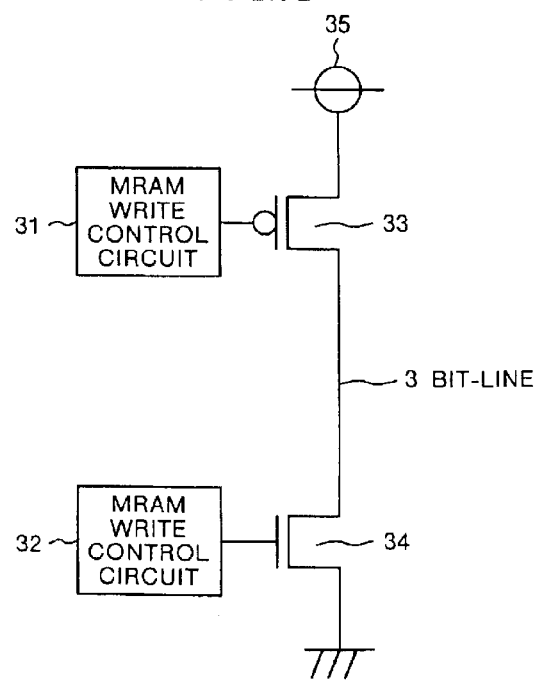
FIG. 3 is a circuit diagram of a control circuit that drives the bit-line shown in FIG. 1.

As shown in FIG. 3, the control circuit that drives any one of the bit-lines 3 includes two MRAM write-control circuits 31 and 32, a PMOS transistor 33, and an NMOS transistor 34. An output terminal of the MRAM write-control circuit 31 is connected to the gate of the PMOS transistor 33. The source of the PMOS transistor 33 is connected to a power supply 35. The drain of the PMOS transistor 33 is connected to the drain of the NMOS transistor 34.

An output terminal of the MRAM write-control circuit 32 is connected to the gate of the NMOS transistor 34. The source of the NMOS transistor 34 is connected to ground. A connection line between drains of the PMOS transistor 33 and the NMOS transistor 34 serves as a bit-line 3. On the basis of a write enable signal, a value, and an address signal, the MRAM write-control circuits 31 and 32 select a bit-line 3 through which a current should flow, and effects control to flow a current in one direction through the selected bit-line 3. In the configuration of FIG. 3, control is effected to flow a current through the bit-line 3 in one direction by turning on the PMOS transistor 33 and the NMOS transistor 34.

Hereafter, embodiments of the control circuit according to the present invention will be explained in detail with reference to accompanying drawings.

Figure 4:
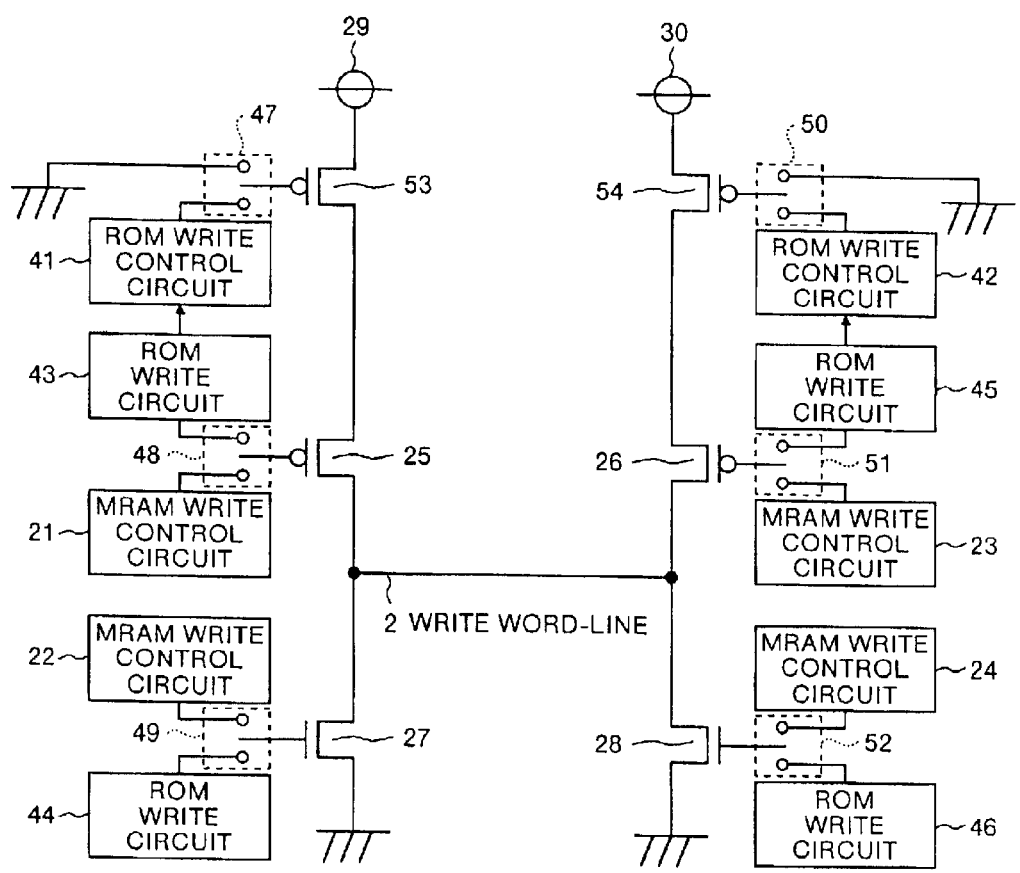
FIG. 4 is a circuit diagram of a control circuit according to a first embodiment of the present invention that drives a write word-line.
Figure 5:
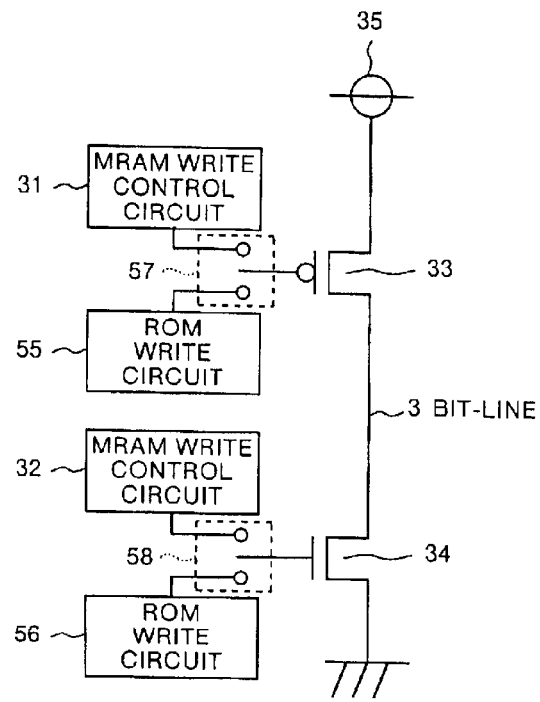
FIG. 5 is a circuit diagram of a control circuit according to a first embodiment of the present invention that drives a bit-line.

FIG. 4 and FIG. 5 show configuration of a control circuit of a first embodiment of the present invention. Precisely, FIG. 4 shows the control circuit that drives the write word-line,
and FIG. 5 shows the control circuit that drives the bit-line. The MRAM is an example of the nonvolatile memory that allows fast random access and, in the first embodiment, an arbitrary region of the MRAM is used here as a ROM.

The configuration of the control circuit according to present invention shown in FIG. 4 is similar to the control circuit that was shown in FIG. 2. The difference between the two control circuits is that, two ROM control circuits 41 and 42, four ROM write circuits 43 to 46, six two-input one-output selectors 47 to 52, and two PMOS transistors 53 and 54 are additionally provided in the configuration of the control circuit according to present invention.

The PMOS transistor 53 is connected between the power supply 29 and the source of the PMOS transistor 25. The PMOS transistor 54 is connected between the power supply 30 and the source of the PMOS transistor 26. That is, these transistors form current sources.

A switchover output terminal of the selector 47 is connected to the gate of the PMOS transistor 53. A first switchover input terminal of the selector 47 is connected to ground. A second switchover input terminal of the selector 47 is connected to an output terminal of the ROM control circuit 41. When the memory is used as an MRAM, the selector 47 connects the gate of the PMOS transistor 53 to the ground. When the memory is used as a ROM, the selector 47 connects the gate of the PMOS transistor 53 to the output terminal of the ROM control circuit 41.

A switchover output terminal of the selector 48 is connected to the gate of the PMOS transistor 25. A first switchover input terminal of the selector 48 is connected to a first output terminal of the ROM write circuit 43. A second switchover input terminal of the selector 48 is connected to an output terminal of the MRAM write-control circuit 21. A second output terminal of the ROM write circuit 43 is connected to an input terminal of the ROM control circuit 41. When the memory is used as an MRAM, the selector 48 connects the gate of the PMOS transistor 25 to the output terminal of MRAM write-control circuit 21. When the memory is used as a ROM, the selector 48 connects the gate of the PMOS transistor 25 to the first output terminal of the ROM write circuit 43.

A switchover output terminal of the selector 49 is connected to the gate of the NMOS transistor 27. A first switchover input terminal of the selector 49 is connected to an output terminal of the MRAM write-control circuit 22. A second switchover input terminal of the selector 49 is connected to an output terminal of the ROM write circuit 44. When the memory is used as an MRAM, the selector 49 connects the gate of the NMOS transistor 27 to the output terminal of MRAM write-control circuit 22. When the memory is used as a ROM, the selector 49 connects the gate of the NMOS transistor 27 to the output terminal of the ROM write circuit 44.

A switchover output terminal of the selector 50 is connected to the gate of the PMOS transistor 54. A first switchover input terminal of the selector 50 is connected to the ground. A second switchover input terminal of the selector 50 is connected to an output terminal of the ROM control circuit 42. When the memory is used as an MRAM, the selector 50 connects the gate of the PMOS transistor 54 to the ground. When the memory is used as a ROM, the selector 50 connects the gate of the PMOS transistor 54 to the output terminal of the ROM control circuit 42.

A switchover output terminal of the selector 51 is connected to the gate of the PMOS transistor 26. A first switchover input terminal of the selector 51 is connected to a first output terminal of the ROM write circuit 45. A second switchover input terminal of the selector 51 is connected to an output terminal of the MRAM write-control circuit 23. A second output terminal of the ROM write circuit 45 is connected to an input terminal of the ROM control circuit 42. When the memory is used as an MRAM, the selector 51 connects the gate of the PMOS transistor 26 to the output terminal of MRAM write-control circuit 23. When the memory is used as a ROM, the selector 51 connects the gate of the PMOS transistor 26 to the first output terminal of the ROM write circuit 45.

A switchover output terminal of the selector 52 is connected to the gate of the NMOS transistor 28. A first switchover input terminal of the selector 52 is connected to an output terminal of the MRAM write-control circuit 24. A second switchover input terminal of the selector 52 is connected to an output terminal of the ROM write circuit 46. When the memory is used as an MRAM, the selector 52 connects the gate of the NMOS transistor 28 to output terminal of the MRAM write-control circuit 24. When the memory is used as a ROM, the selector 52 connects the gate of the NMOS transistor 28 to the output terminal of the ROM write circuit In FIG. 5, ROM write circuits 55 and 56 and selectors 57 and 58 are added to the configuration shown in FIG. 3.

A switchover output terminal of the selector 57 is connected to the gate of the PMOS transistor 33. A first switchover input terminal of the selector 57 is connected to an output terminal of the MRAM write-control circuit 31. A second switchover input terminal of the selector 57 is connected to an output terminal of the ROM write circuit 55. When the memory is used as an MRAM, the selector 57 connects the gate of the PMOS transistor 33 to the output terminal of MRAM write-control circuit 31. When the memory is used as a ROM, the selector 57 connects the gate of the PMOS transistor 33 to the output terminal of the ROM write circuit 55.

A switchover output terminal of the selector 58 is connected to the gate of the NMOS transistor 34. A first switchover input terminal of the selector 58 is connected to an output terminal of the MRAM write-control circuit 32. A second switchover input terminal of the selector 58 is connected to an output terminal of the ROM write circuit 56. When the memory is used as an MRAM, the selector 58 connects the gate of the NMOS transistor 34 to the output terminal of MRAM write-control circuit 32. When the memory is used as a ROM, the selector 58 connects the gate of the NMOS transistor 34 to the output terminal of the ROM write circuit 56.

Operation conducted in the configuration when an arbitrary memory region of the MRAM is used as a ROM will now be explained. That is, in FIG. 4, the selector 47, the selector 48, the selector 49, the selector 50, the selector 51 and the selector 52 select the ROM control circuit 41, the ROM write circuit 43, the ROM write circuit 44, the ROM control circuit 42, the ROM write circuit 45 and the ROM write circuit 46, respectively. In FIG. 5, the selector 57 and selector 58 select the ROM write circuit 55 and the ROM write circuit 56, respectively.

The ROM control circuits 41 and 42 can control an ordinary mode in which writing is not conducted and a write mode in which writing is conducted, respectively independently. The ROM control circuits 41 and 42 are provided with terminals in order to set these modes. According to the setting, the ROM control circuits 41 and 42 output mode signals in order to effect ON/OFF control on the PMOS transistors 53 and 54 that serve as current sources, respectively.

To be concrete, in the ordinary mode, both the ROM control circuits 41 and 42 output high levels. As a result, the PMOS transistors 53 and 54 turn off. In this state, a current does not flow through the write word-line 2 and writing is not conducted. Even if a current does not flow through the write word-line 2, reading is not affected and consequently any problem is not caused.

On the other hand, in the write mode, both the ROM control circuits 41 and 42 output low levels. As a result, the PMOS transistors 53 and 54 turn on. In this state, the ROMNWRs 43, 44, 45 and 46 control current supply to the write word-line 2 and writing can be conducted.

In writing, the ROM write circuit 53 turns on the PMOS transistor 25 and the ROM write circuit 46 turns on the NMOS transistor 28, or the ROM write circuit 45 turns on the PMOS transistor 26 and the ROM write circuit 44 turns on the NMOS transistor 27. In FIG. 5, the ROM write circuit 55 turns on the PMOS transistor 33 and the ROM write circuit 56 turns on the NMOS transistor 34.

When the ROM control circuits 41 and 42 are in the write mode, the ROM write circuits 43, 44, 45, 55 and 56 flow currents through all write word-lines 1 that concern the region to be used as a ROM in the same direction, and flow currents through all bit-lines 3. As a result, erasing can be conducted in the lump.

Erasing and writing can be executed according to commands. When the ROM control circuits 41 and 42 are in the write mode, erasing can be conducted by receiving a command, flowing a current through each of the specified write word-lines 2 in the same direction, and flowing a current through each of the bit-lines 3. When the ROM control circuits 41 and 42 are in the write mode, writing can be conducted by receiving a command, and controlling the sense of the current flown through the specified write word-lines 2. As a result, use like the well-known flash memory becomes possible.

When the ROM control circuits 41 and 42 are in the write mode, it also becomes possible to protect against unprepared writing by outputting a protect signal from the ROM write circuit 43 to ROM control circuit 41, outputting a protect signal from the ROM write circuit 45 to ROM control circuit 42, thereby forcibly shifting the ROM control circuits 41 and 42 to the ordinary mode, and turning off the PMOS transistors 53 and 54 that serve as current sources.

According to the first embodiment, it is thus possible to set an arbitrary memory region of an MRAM that serve as a nonvolatile memory allowing fast random access to a write state or a state in which writing is not conducted (i.e., a state in which only reading is possible). As a result, an arbitrary memory region of the MRAM can be used as if it is a ROM. At that time, it is possible to prevent rewriting from being effected even if runaway of a program should occur. Therefore, it also becomes possible to ensure the security.

Figure 6:
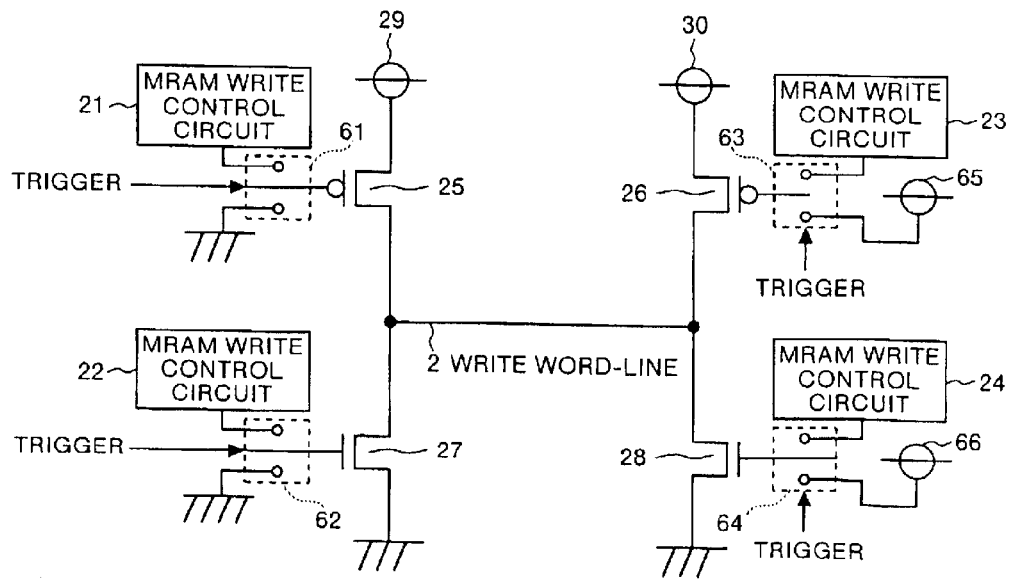
FIG. 6 is a circuit diagram of a control circuit according to a second embodiment of the present invention that drives a write word-line.
Figure 7:
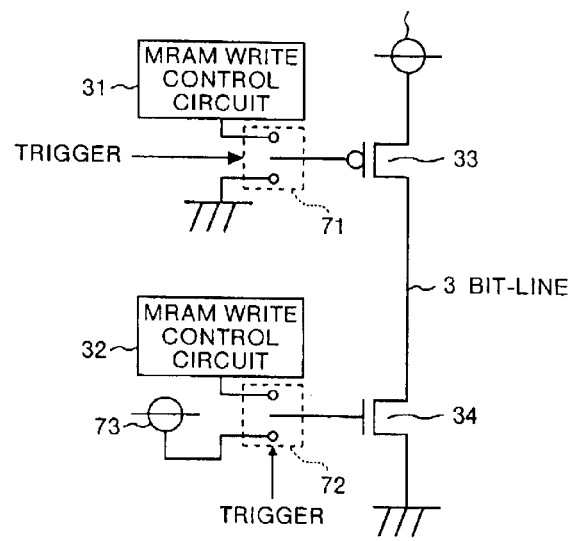
FIG. 7 is a circuit diagram of a control circuit according to a first embodiment of the present invention that drives a bit-line.

FIG. 6 and FIG. 7 show configuration of a control circuit of a second embodiment of the present invention. Precisely, FIG. 6 shows the control circuit that drives the write word-line, and FIG. 7 shows the control circuit that drives the bit-line. In FIGS. 6 and 7, components that are the same as or equivalent to those shown in FIGS. 2 and 3 are denoted by like characters. A portion that concerns the second embodiment will now be explained mainly. The MRAM is an example of the nonvolatile memory that allows fast random access and, in the second embodiment, an arbitrary region of the MRAM is used here as a RAM.

In FIG. 6, two-input one-output selectors 61, 62, 63 and 64 are added to the configuration shown in FIG. 2.

A switchover output terminal of the selector 61 is connected to the gate of the PMOS transistor 25. A first switchover input terminal of the selector 61 is connected to an output terminal of the MRAM write-control circuit 21. A second switchover input terminal of the selector 61 is connected to ground. The selector 61 ordinarily connects the gate of the PMOS transistor 25 to the output terminal of the MRAM write-control circuit 21. When a trigger is input from the outside, however, the selector 61 connects the gate of the PMOS transistor 25 to the ground.

A switchover output terminal of the selector 62 is connected to the gate of the NMOS transistor 27. A first switchover input terminal of the selector 62 is connected to an output terminal of the MRAM write-control circuit 22. A second switchover input terminal of the selector 62 is connected to the ground. The selector 62 ordinarily connects the gate of the NMOS transistor 27 to the output terminal of the MRAM write-control circuit 22. When a trigger is input from the outside, however, the selector 62 connects the gate of the NMOS transistor 27 to the ground.

A switchover output terminal of the selector 63 is connected to the gate of the PMOS transistor 26. A first switchover input terminal of the selector 63 is connected to an output terminal of the MRAM write-control circuit 23. A second switchover input terminal of the selector 63 is connected to a power supply 65. The selector 63 ordinarily connects the gate of the PMOS transistor 26 to the output terminal of the MRAM write-control circuit 23. When a trigger is input from the outside, however, the selector 63 connects the gate of the PMOS transistor 26 to the power supply 65.

A switchover output terminal of the selector 64 is connected to the gate of the NMOS transistor 28. A first switchover input terminal of the selector 64 is connected to an output terminal of the MRAM write-control circuit 24. A second switchover input terminal of the selector 64 is connected to a power supply 66. The selector 64 ordinarily connects the gate of the NMOS transistor 28 to the output terminal of the MRAM write-control circuit 24. When a trigger is input from the outside, however, the selector 64 connects the gate of the NMOS transistor 28 to the power supply 66.

In FIG. 7, two-input one-output selectors 71 and 72 are added to the configuration shown in FIG. 3.

A switchover output terminal of the selector 71 is connected to the gate of the PMOS transistor 33. A first switchover input terminal of the selector 71 is connected to an output terminal of the MRAM write-control circuit 31. A second switchover input terminal of the selector 71 is connected to ground. The selector 71 ordinarily connects the gate of the PMOS transistor 33 to the output terminal of the MRAM write-control circuit 31. When a trigger is input from the outside, however, the selector 71 connects the gate of the PMOS transistor 33 to the ground.

A switchover output terminal of the selector 72 is connected to the gate of the NMOS transistor 34. A first switchover input terminal of the selector 72 is connected to an output terminal of the MRAM write-control circuit 32. A second switchover input terminal of the selector 72 is connected to a power supply 73. The selector 72 ordinarily connects the gate of the NMOS transistor 34 to the output terminal of the MRAM write-control circuit 32. When a trigger is input from the outside, however, the selector 72 connects the gate of the NMOS transistor 34 to the power supply 73.

Operation conducted in the configuration when an arbitrary memory region of the MRAM is used as a RAM will now be explained.

In FIG. 6, ordinarily the selector 61, the selector 62, the selector 63 and the selector 64 select the MRAM write-control circuit 21, the MRAM write-control circuit 22, the MRAM write-control circuit 23 and the MRAM write-control circuit 24, respectively. In FIG. 7, ordinarily the selector 71 selects the MRAM write-control circuit 31 and the selector 72 selects the MRAM write-control circuit 32. In other words, when conducting ordinary writing for RAM on an arbitrary memory region of the MRAM, writing is conducted by utilizing the function of the MRAM.

If a trigger is input from the outside, then a state that data are erased when power of the RAM is switched off is implemented by controlling the selectors 61 to 64, 71 and 72 in switchover, thereby flowing a current in one direction through every write word-line 2 that concerns an arbitrary memory region to be used as the RAM, simultaneously flowing a current through every bit-line 3, and writing all "1" or all "0" in the arbitrary memory region.

In the example of FIG. 6, the selector 61, the selector 62, the selector 63 and the selector 64 respectively select the ground, the ground, the power supply 65 and the power supply 66 in the arbitrary region to be used as the RAM. As a result, current flows in one direction (a rightward direction in the example of FIG. 6) through every write word-line 2 that concerns an arbitrary memory region to be used as the RAM.

In the example of FIG. 7, the selector 71 selects the ground and the selector 72 selects the power supply 75. As a result, current flows through every bit-line 3 that concerns an arbitrary memory region to be used as the RAM.

As the trigger, a signal judged by a dedicated terminal, software, or a voltage level may be used besides a reset signal. To be concrete, a dedicated terminal to which an erase command can be input by a program is provided besides the reset terminal in order to be able to effect blanket erasing even during operation of respective modules. Or, for example, a program that generates a reset signal may be prepared as software. Or an erase command may be written in a predetermined register. Or blanket erasing may be executed when a voltage drop is a predetermined voltage level by using a power supply voltage detection function. This method is effective when the power supply is directly switched off without causing the reset. By using these signals, flexible blanket erasing becomes possible. If each of the above triggers can be enabled or disabled, more flexibility is obtained.

According to the second embodiment, it is thus possible to implement the state obtained at the time of power supply off by using the trigger, when using an arbitrary memory region of an MRAM as if it is a RAM. As a result, it becomes possible to obviate the risk that data are read by another person inadvertently and ensure the security.

Figure 8:
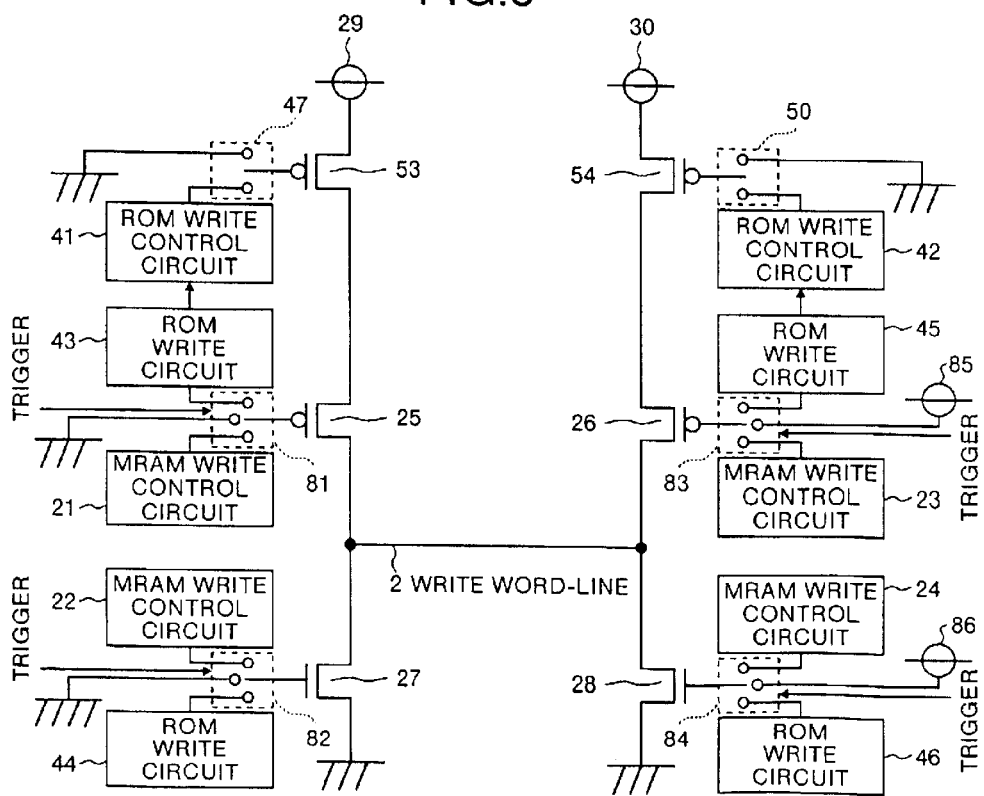
FIG. 8 is a circuit diagram of a control circuit according to a third embodiment of the present invention that drives a write word-line.
Figure 9:
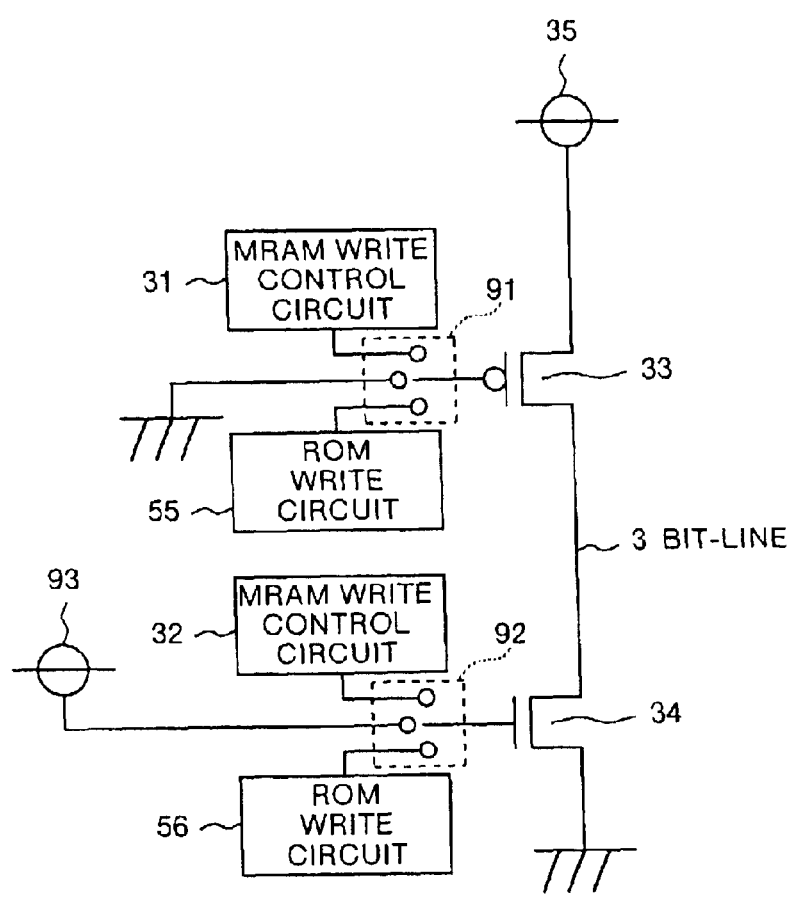
FIG. 9 is a circuit diagram of a control circuit according to a third embodiment of the present invention that drives a bit-line.

FIG. 8 and FIG. 9 show configuration of a control circuit of a third embodiment of the present invention. Precisely, FIG. 8 shows the control circuit that drives the write word-line, and FIG. 9 shows the control circuit that drives the bit-line. In FIGS. 8 and 9, components that are the same as or equivalent to those shown in FIGS. 4 and 5 are denoted by like characters. A portion that concerns the third embodiment will now be explained mainly. The MRAM is an example of the nonvolatile memory that allows fast random access and, in the first embodiment, an arbitrary region of the MRAM is used here as a ROM, a RAM, and an MRAM.

In FIG. 8, three-input one-output selectors 81, 82, 83 and 84 are provided instead of the two-input one-output selectors 48, 49, 51 and 52 in the configuration shown in FIG. 4.

Three inputs of the selector 81 are connected to the ROM write circuit 43, ground and the MRAM write-control circuit 21, respectively. Three inputs of the selector 82 are connected to the MRAM write-control circuit 22, the ground and the ROM write circuit 44, respectively. Three inputs of the selector 83 are connected to the ROM write circuit 45, a power supply 85 and the MRAM write-control circuit 23, respectively. Three inputs of the selector 84 are connected to the MRAM write-control circuit 24, a power supply 86 and the ROM write circuit 46, respectively.

In FIG. 9, three-input one-output selectors 91 and 92 are provided instead of the two-input one-output selectors 57 and 58 in the configuration shown in FIG. 5.

Three inputs of the selector 91 are connected to the MRAM write-control circuit 31, the ground and the ROM write circuit 55, respectively. Three inputs of the selector 92 are connected to the MRAM write-control circuit 32, a power supply 93 and the ROM write circuit 56, respectively.

Operation conducted when an arbitrary memory region of the MRAM is used as an MRAM, a ROM, and a RAM will now be explained.

When an arbitrary memory region is used as an MRAM, each of the selectors 47 and 50 shown in FIG. 8 selects the ground to always bring the PMOS transistors 53 and 54 in the on-state. In this state, the selector 81, the selector 82, the selector 83 and the selector 84 select the MRAM write-control circuit 21, the MRAM write-control circuit 22, the MRAM write-control circuit 23 and the MRAM write-control circuit 24, respectively. In FIG. 9, the selector 91 selects the MRAM write-control circuit 31 and the selector 92 selects the MRAM write-control circuit 32. As a result, the MRAM write-control circuits 21 to 24, 31 and 32 operate as explained earlier with reference to FIGS. 2 and 3. Therefore, the arbitrary memory region can be used as an MRAM as usual.

When the arbitrary memory region is used as a ROM, the selector 47 shown in FIG. 8 selects the ROM control circuit 41 and the selector 50 selects the ROM control circuit 42. As explained with reference to the first embodiment, the ROM control circuit 41 and the ROM control circuit 42 effects control in response to a mode signal in order to set the PMOS transistors 53 and 54, which serve as current sources, to a non-conduction state in the ordinary mode and set the PMOS transistors 53 and 54 to a conduction state in the write mode.

The selector 81, the selector 82, the selector 83 and the selector 84 select the ROM write circuit 43, the ROM write circuit 44, the ROM write circuit 45 and the ROM write circuit 46, respectively. In FIG. 9, the selector 91 selects the ROM write circuit 55 and the selector 92 selects the ROM write circuit 56. As a result, the ROM write circuits 43 to 46, 55 and 56 operate as explained earlier with reference to the first embodiment. Therefore, the arbitrary memory region can be used as a ROM. As explained with reference to the first embodiment, blanket erasing can also be executed by the ROM write circuits 43 to 46, 55 and 56.

When the arbitrary memory region is used as a RAM, the selectors 47 and 50 shown in FIG. 8 selects the ground to always bring the PMOS transistors 53 and 54 in the on-state. In this state, until a trigger in input, the selector 81, the selector 82, the selector 83 and the selector 84 select the MRAM write-control circuit 21, the MRAM write-control circuit 22, the MRAM write-control circuit 23 and the MRAM write-control circuit 24, respectively. In FIG. 9, the selector 91 selects the MRAM write-control circuit 31 and the selector 92 selects the MRAM write-control circuit 32.

When the trigger is input, the selectors 81 and 82 shown in FIG. 8 select the ground, and the selector 83 and the selector 84 select the power supply 85 and the power supply 86, respectively. In FIG. 9, the selector 91 selects the ground and the selector 92 selects the power supply 93. As a result, the erasing operation explained with reference to the second embodiment is conducted. Therefore, the arbitrary memory region can be used as the RAM. If the arbitrary memory region is used as an MRAM from the beginning, however, the operation of the blanket erasing heretofore explained is not conducted even if the trigger is input.

According to the third embodiment, it thus becomes possible to selectively use an MRAM, which is provided as a nonvolatile memory allowing fast random access, as a ROM, a RAM or an MRAM. Therefore, the user can use the memory region flexibly according to the application.

As a fourth embodiment, a method for setting an arbitrary memory region of a nonvolatile memory allowing fast random access, to be used as a ROM or a RAM is explained. The MRAM is taken as an example of the nonvolatile memory.

In the example explained with reference to the third embodiment (FIGS. 8 and 9), there are prepared the selectors 81 to 84, 91 and 92, which have RAM control functions in order to select the ground or the power supply when effecting blanket erasing in response to a trigger signal. An arbitrary memory region determined by user's specifications is set by hardware or software.

In a setting method using hardware, a circuit is formed so that regions to be used by respective memories may be assigned by reconnection of wiring and partial reconnection of wiring may be effected by changing the mask later. Or there can be adopted a method of using fuses and cutting fuses before an assembly process, instead of changing the mask.

In a setting method using software, there can be adopted a method of conducting the switchover operations of the selectors 47, 50, 81 to 84, 91 and 92 by program control of a CPU or terminal setting. In this method, the user can arbitrarily assign respective memory regions to the MRAM, ROM and RAM.

According to the present invention, it is possible to prevent inadvertent rewriting even if a computer program runaway occurs, when a nonvolatile memory is used as a ROM. Moreover, since data written in the non-volatile memory deleted when the power supply is switched off, the non-volatile memory becomes more secure and can be used as a RAM. Moreover, the non-volatile memory can be used a flash memory. Moreover, blanket erasing can be executed with respect to the non-volatile memory. Moreover, an arbitrary region of the non-volatile memory can be set and this region can be used as the non-volatile memory, the ROM, or the RAM.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A memory write control device that controls writing of bit information in a plurality of nonvolatile memory cells, each one of the nonvolatile memory cells located at a crossing point of a plurality of bit-lines and a plurality of word-lines arranged in a matrix form, by controlling a direction of a current supplied to each of the word-lines, the memory write control device comprising:

a current supply control unit that receives a current generated by a current source and a mode signal indicating the memory cells are used as one of a RAM and a ROM, and outputs the received current in accordance with the mode signal;

a first current direction control unit that supplies the current output by the current supply control unit to each of the bit-lines in a predetermined direction; and a second current direction control unit that supplies the current output by the current supply control unit to the word-lines and controls a direction of the current supplied to each of the word-lines.

2. The memory write control device according to claim 1, further comprising a mode signal generation unit that generates the mode signal corresponding to each of the non-volatile memory cells, wherein the current supply control unit outputs the current to each of the word-lines and the bit-lines according to the corresponding mode signal.

3. The memory write control device according to claim 1, wherein each of the nonvolatile memory cell is a magnetic random access memory.

4. The memory write control device according to claim 1, wherein the current supply control unit includes
   a first current supply control unit that receives the current generated by the current source and the mode signal, and performs one of operations in accordance with the mode signal, the operations being outputting the received current, not outputting the received current, and supplying the received current in a predetermined direction to each of the word-lines; and
   a second current supply control unit that receives the current supplied by the current source and the mode signal, and performs one of operations in accordance with the mode signal, the operations being outputting the received current, not outputting the received current, and supplying the received current in a predetermined direction to each of the bit-lines,
   wherein the first current direction control unit supplies the current output by the first current supply control unit to each of the bit-lines in a predetermined direction, in accordance with the mode signal; and
   the second current direction control unit supplies the current output by the second current supply control unit to the word-lines and controls the direction of the current supplied to each of the word-lines, in accordance with the mode signal.

5. A memory write control device that controls writing of bit information in a plurality of nonvolatile memory cells, each one of the nonvolatile memory cells located at a crossing point of a plurality of bit-lines and a plurality of word-lines arranged in a matrix form, by controlling a direction of a current supplied to each of the word-lines, the memory write control device comprising:
   a current supply control unit that supplies a current generated by a current source to each of the bit-lines and word-lines in a predetermined direction, in accordance with a trigger signal indicating a data erase;
   a first current direction control unit that supplies the current generated by the current source to each of the bit-lines in a predetermined direction, in accordance with the trigger signal; and
   a second current direction control unit that supplies the current generated by the current source to the word-lines and controls the direction of the current supplied to each of the word-lines, in accordance with the trigger signal.

6. The memory write control device according to claim 5, further comprising a trigger signal generation unit that generates the trigger signal when a power source is turned off or reset.

7. The memory write control device according to claim 5, wherein the current supply control unit, the first current direction control unit, and the second current direction control unit supply the current generated by a current source to one or a plurality of predetermined bit-lines and word-lines in accordance with a trigger signal.

8. The memory write control device according to claim 5, wherein each of the nonvolatile memory cell is a magnetic random access memory.

9. A memory write control device that controls writing of bit information in a plurality of nonvolatile memory cells, each one of the nonvolatile memory cells located at a crossing point of a plurality of bit-lines and a plurality of word-lines arranged in a matrix form, by controlling a direction of a current supplied to each of the word-lines, the memory write control device comprising:
   a first current supply control unit that receives a current supplied by a current source, and a mode signal indicating the memory cells are used as one of a ROM and a RAM, and performs one of operations in accordance with the mode signal, the operations that are outputting the received current, not outputting the received current, and supplying the received current in a predetermined direction to each of the word-lines;
   a second current supply control unit that receives the current supplied by the current source and the mode signal, and performs one of operations in accordance with the mode signal, the operations that are outputting the received current, not outputting the received current, and supplying the received current to each of the bit-lines in a predetermined direction;
   a third current supply control unit that supplies the current supplied by the current source to each of the bit-lines and word-lines in a predetermined direction, in accordance with a trigger signal indicating a data erase;
   a first current direction control unit that supplies the current output by the first current supply control unit to each of the bit-lines in a predetermined direction, in accordance with the mode signal; and
   a second current direction control unit that supplies the current output by the second current supply control unit to the word-lines and controls the direction of the current supplied to each of the word-lines, in accordance with the mode signal.

10. The memory write control device according to claim 9, further comprising a trigger signal generation unit that generates the trigger signal when a power source is turned off or reset.

11. The memory write control device according to claim 9, further comprising a mode signal generation unit that generates the mode signal corresponding to each of the nonvolatile memory cells, wherein the current supply control unit outputs the current to each of the word-lines and bit-lines according to the corresponding mode signal.

12. The memory write control device according to claim 9, wherein the first current direction control unit, and the second current direction control unit supply the current generated by a current source to one or a plurality of predetermined bit-lines and word-lines in accordance with a trigger signal.

13. The memory write control device according to claim 9, wherein each of the nonvolatile memory cell is a magnetic random access memory.

14. A magnetic memory comprising:
   a bit line;
   a word line which crosses the bit line, and which has a first node and a second node;
   a magnetic memory cell located at a crossing point of the bit line and the word line;
   a first current path which is connected to the first mode, and which includes a first ROM control circuit and a first write circuit; and
   a second current path which is connected to the second node, and which includes a second ROM control circuit and a second write circuit, wherein
   the first ROM control circuit supplies a first specific current, when receiving an MRAM mode signal, to the first write circuit, and does not supply the first specific current, when receiving a ROM normal mode signal, to the first write circuit,
   the first write circuit passes the first specific current supplied, when receiving a first writing signal that indicates a first memory state, to the word line so that the first specific current flows from the first node to the second node, the second ROM control circuit supplies a second specific current, when receiving a MRAM mode signal, to the second write circuit, and does not supply the second specific current, when receiving a ROM normal mode signal, to the first write circuit, and the second write circuit passes the second specific current supplied, when receiving a second writing signal that indicates a second memory state, to the word line so that the second specific current flows from the second node to the first node.

15. The magnetic memory according to claim 14, further comprising a third current path which includes a third write circuit, wherein the third write circuit supplies a third specific current, when receiving a writing signal that indicates one of the first and second memory states, to the bit line.

16. A magnetic memory comprising:

a bit line;

a word line which crosses the bit line, and which has a first node and a second node;

a magnetic memory cell located at a crossing point of the bit line and the word line;

a first current path which is connected to the first node, which includes a first write circuit; and a second current path which is connected to the second node, and which includes a second write circuit, wherein the first write circuit supplies a first specific current, when receiving one of a first writing signal that indicates a first memory state and a reset signal that indicates initialization of the magnetic memory cell, to the word line so that the first specific current flows from the first node to the second node, and the second write circuit supplies a second specific current, when receiving a second writing signal that indicates a second memory state, to the word line so that the second specific current flows from the second node to the first node.

17. The magnetic memory according to claim 16, further comprising a third current path which includes a third write circuit, wherein the third write circuit supplies a third specific current, when receiving one of a reset signal that indicates initialization of the magnetic memory cell and a writing signal that indicates one of the first and second memory states, to the bit line.

18. A magnetic memory comprising:

a bit line;

a word line which crosses the bit line, and which has a first node and a second node;

a magnetic memory cell located at a crossing point of the bit line and the word line;

a first current path which is connected to the first node, and which includes a first ROM control circuit and a first write circuit; and a second current path which is connected to the second node, and which includes a second ROM control circuit and a second write circuit, wherein the first ROM control circuit supplies a first specific current, when receiving an MRAM mode signal, to the first write circuit and does note supply the first specific current, when receiving a ROM normal mode signal, to the first write circuit, the first write circuit passes the first specific current supplied, when receiving one of a first writing signal that indicates a first memory state and a reset signal that indicates initialization of the magnetic memory cell, to the word line so that the first specific current flows from the first node to the second node, the second ROM control circuit supplies a second specific current, when receiving an MRAM mode signal, to the second write circuit, and does not supply the second specific current, when receiving a ROM normal mode signal, to the first write circuit, and the second write circuit passes the second specific current supplied, when receiving a second writing signal that indicates a second memory state, to the word line so that the second specific current flows from the second node to the first node.

19. The magnetic memory according to claim 18, further comprising a third current path which includes a third write circuit, wherein the third write circuit supplies a third specific current, when receiving one of a reset signal that indicates initialization of the magnetic memory cell and a writing signal that indicates one of the first and second memory states, to the bit line.

* * * * *